US012085338B2

(12) United States Patent
Kosugi et al.

(10) Patent No.: US 12,085,338 B2
(45) Date of Patent: Sep. 10, 2024

(54) HEATER, TEMPERATURE CONTROL SYSTEM, AND PROCESSING APPARATUS

(71) Applicant: KOKUSAI ELECTRIC CORPORATION, Tokyo (JP)

(72) Inventors: Tetsuya Kosugi, Toyama (JP); Masaaki Ueno, Toyama (JP); Shinobu Sugiura, Toyama (JP); Masashi Sugishita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 383 days.

(21) Appl. No.: 16/899,041

(22) Filed: Jun. 11, 2020

(65) Prior Publication Data

US 2020/0393197 A1 Dec. 17, 2020

(30) Foreign Application Priority Data

Jun. 12, 2019 (JP) ................................ 2019-109838
Apr. 15, 2020 (JP) ................................ 2020-073076

(51) Int. Cl.
*F27B 17/00* (2006.01)
*H01L 21/67* (2006.01)
(Continued)

(52) U.S. Cl.
CPC .... *F27B 17/0025* (2013.01); *H01L 21/67109* (2013.01); *H01L 21/67248* (2013.01);
(Continued)

(58) Field of Classification Search
CPC ......... H01L 21/67757; H01L 21/67109; H01L 21/67248; H01L 21/67098;
(Continued)

(56) References Cited

U.S. PATENT DOCUMENTS 4,484,243 A * 11/1984 Herbst .................... H02H 5/043
219/509
6,352,594 B2 * 3/2002 Cook .................. C23C 16/4584
118/724

(Continued)

FOREIGN PATENT DOCUMENTS

| JP | 07-078830 A | 3/1995 |
| JP | 11-195610 A | 7/1999 |

(Continued)

OTHER PUBLICATIONS

Korean Office Action issued on Apr. 8, 2022 for Korean Patent Application No. 10-2020-0070213.

(Continued)

*Primary Examiner* — John P. Dulka
(74) *Attorney, Agent, or Firm* — Volpe Koenig

(57) ABSTRACT

There is provided a technique that includes: a heat generator installed for each of control zones and configured to raise an internal temperature of a reaction tube by heat generation; a circuit configured to equalize resistance values in the respective control zones, wherein the circuit is a parallel circuit and is configured such that an output variable element is installed in one or more of output circuits constituting the parallel circuit.

18 Claims, 14 Drawing Sheets

(51) Int. Cl.
*H05B 1/02* (2006.01)
*H05B 3/00* (2006.01)

(52) U.S. Cl.
CPC ......... *H05B 1/0233* (2013.01); *H05B 3/0019* (2013.01); *H05B 3/0047* (2013.01); *H05B 2203/035* (2013.01); *H05B 2203/037* (2013.01)

(58) Field of Classification Search
CPC ........ H05B 2203/037; H05B 2203/035; H05B 1/0233; H05B 3/0019; H05B 3/0047; F27B 17/0025
See application file for complete search history.

(56) References Cited

U.S. PATENT DOCUMENTS

| | | | |
|---|---|---|---|
| 11,088,002 B2* | 8/2021 | Pierreux | H01L 21/67757 |
| 2006/0054616 A1* | 3/2006 | Ptasienski | H05B 3/46 219/543 |
| 2007/0039938 A1* | 2/2007 | Peck | F27D 11/02 219/201 |
| 2012/0223066 A1* | 9/2012 | Yoshii | F27D 19/00 219/390 |
| 2013/0065189 A1 | 3/2013 | Yoshii et al. | |
| 2019/0276938 A1 | 9/2019 | Sugishita et al. | |

FOREIGN PATENT DOCUMENTS

| | | |
|---|---|---|
| JP | 2000-223427 A | 8/2000 |
| JP | 2000-339039 A | 12/2000 |
| JP | 2002-093714 A | 3/2002 |
| JP | 2004-288775 A | 10/2004 |
| JP | 2009-281837 A | 12/2009 |
| JP | 2011-108596 A | 6/2011 |
| KR | 10-2005-0088989 A | 9/2005 |
| KR | 10-2013-0029009 A | 3/2013 |
| TW | 200718263 A | 5/2007 |
| WO | 2018/100826 A1 | 6/2018 |
| WO | 2018/105113 A1 | 6/2018 |
| WO | 2018/182013 A1 | 10/2018 |

OTHER PUBLICATIONS

Japanese Office Action issued on Feb. 22, 2022 for Japanese Patent Application No. 2020-073076.
Taiwan Office Action issued on Oct. 4, 2021 for Taiwan Patent Application No. 109129505.
Korean Office Action issued on Oct. 8, 2021 for Korean Patent Application No. 10-2020-0070213.
Taiwanese Office Action issued on May 12, 2021 for Taiwanese Patent Application No. 109119397.
Singapore Search Report issued on Feb. 6, 2024 for Singapore Patent Application No. 10202005542R.
Singapore Written Opinion issued on Feb. 6, 2024 for Singapore Patent Application No. 10202005542R.

* cited by examiner

| No. | Temperature zone | Upper_Ratio | Lower_Ratio |
|---|---|---|---|
| 1 | 200 °C | 1.00 | 1.00 |
| 2 | 400 °C | 1.03 | 0.97 |
| 3 | 600 °C | 1.07 | 0.93 |
| 4 | 800 °C | 1.10 | 0.90 |

FIG. 17A
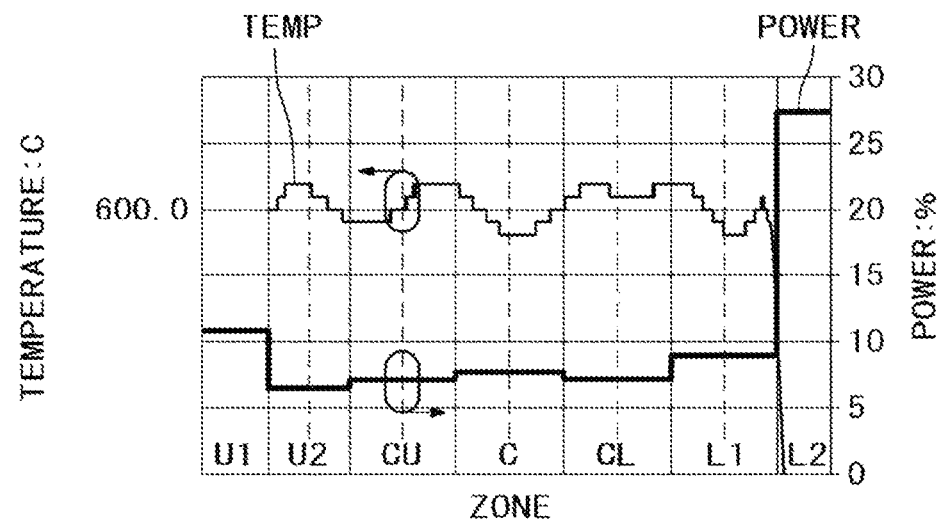
FIG. 17B
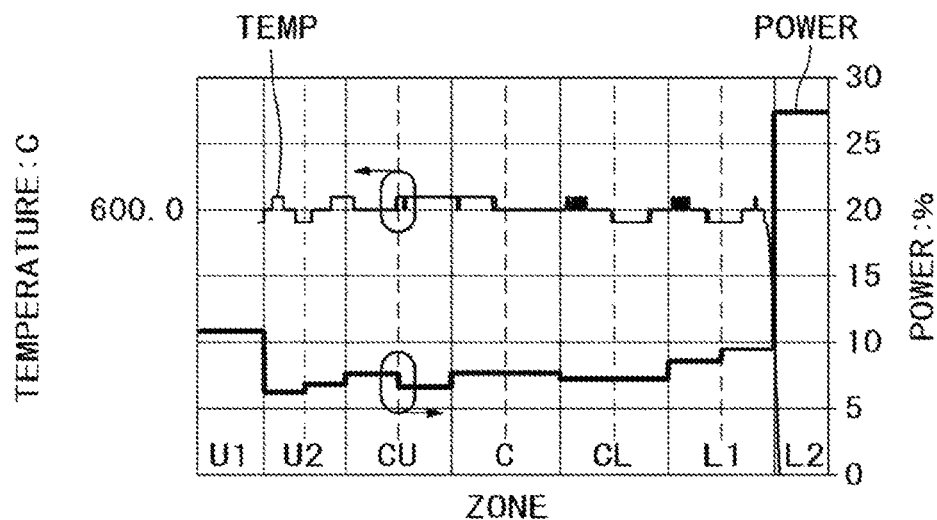
FIG. 17C
|  | U2 | CU | C | CL | L1 |
|---|---|---|---|---|---|
| Upper_Ratio | 0.95 | 1.07 | 1.00 | 1.00 | 0.95 |
| Lower_Ratio | 1.05 | 0.93 | 1.00 | 1.00 | 1.05 |

HEATER, TEMPERATURE CONTROL SYSTEM, AND PROCESSING APPARATUS

CROSS-REFERENCE TO RELATED APPLICATION

This application is based upon and claims the benefit of priority from Japanese Patent Application No. 2019-109838, filed on Jun. 12, 2019, and Japanese Patent Application No. 2020-073076, filed on Apr. 15, 2020, the entire contents of which are incorporated herein by reference.

TECHNICAL FIELD

The present disclosure relates to a heater, a temperature control system, and a processing apparatus.

BACKGROUND

It is known that a semiconductor manufacturing apparatus is an example of a substrate processing apparatus and a vertical type apparatus is an example of the semiconductor manufacturing apparatus. In the vertical type apparatus, a boat as a substrate holding part which holds a plurality of substrates (hereinafter, also referred to as wafers) in multiple stages is loaded into a process chamber in a reaction tube while holding the substrates to process the substrates at a predetermined temperature while controlling the temperature in multiple zones.

For example, in the related art, there is disclosed a technique in which flow rate and flow velocity of a gas injected from an opening toward a reaction tube are adjusted by opening and closing a control valve so that a temperature difference between multiple zones during temperature dropping is uniform. Further, in the related art, there is disclosed a technique in which heating by a heater unit and cooling by a gas supplied from the control valve are performed in parallel to follow a predetermined temperature rising rate and a predetermined temperature dropping rate. In recent years, a demand for film thickness uniformity between wafers has been increased with miniaturization, and it has been attempted to improve uniformity of temperature distribution in a furnace during substrate processing.

SUMMARY

The present disclosure provides some embodiments of a configuration capable of further improving uniformity of temperature distribution in a furnace.

According to an embodiment of the present disclosure, there is provided a technique that includes: a heat generator installed for each of control zones and configured to raise an internal temperature of a reaction tube by heat generation; and a circuit configured to equalize resistance values in the respective control zones, wherein the circuit is a parallel circuit and is configured such that an output variable element is installed in one or more of output circuits constituting the parallel circuit.

BRIEF DESCRIPTION OF DRAWINGS

The accompanying drawings, which are incorporated in and constitute a part of the specification, illustrate embodiments of the present disclosure.

in FIG. 15.

FIG. 17A is a diagram illustrating a power distribution and an in-furnace temperature distribution according to a comparative example, FIG. 17B is a diagram illustrating a power distribution and an in-furnace temperature distribution according to an exemplary modification, and FIG. 17C is a diagram illustrating balance parameters for each control zone.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of the present disclosure will now be described with reference to the drawings.

Figure 1:
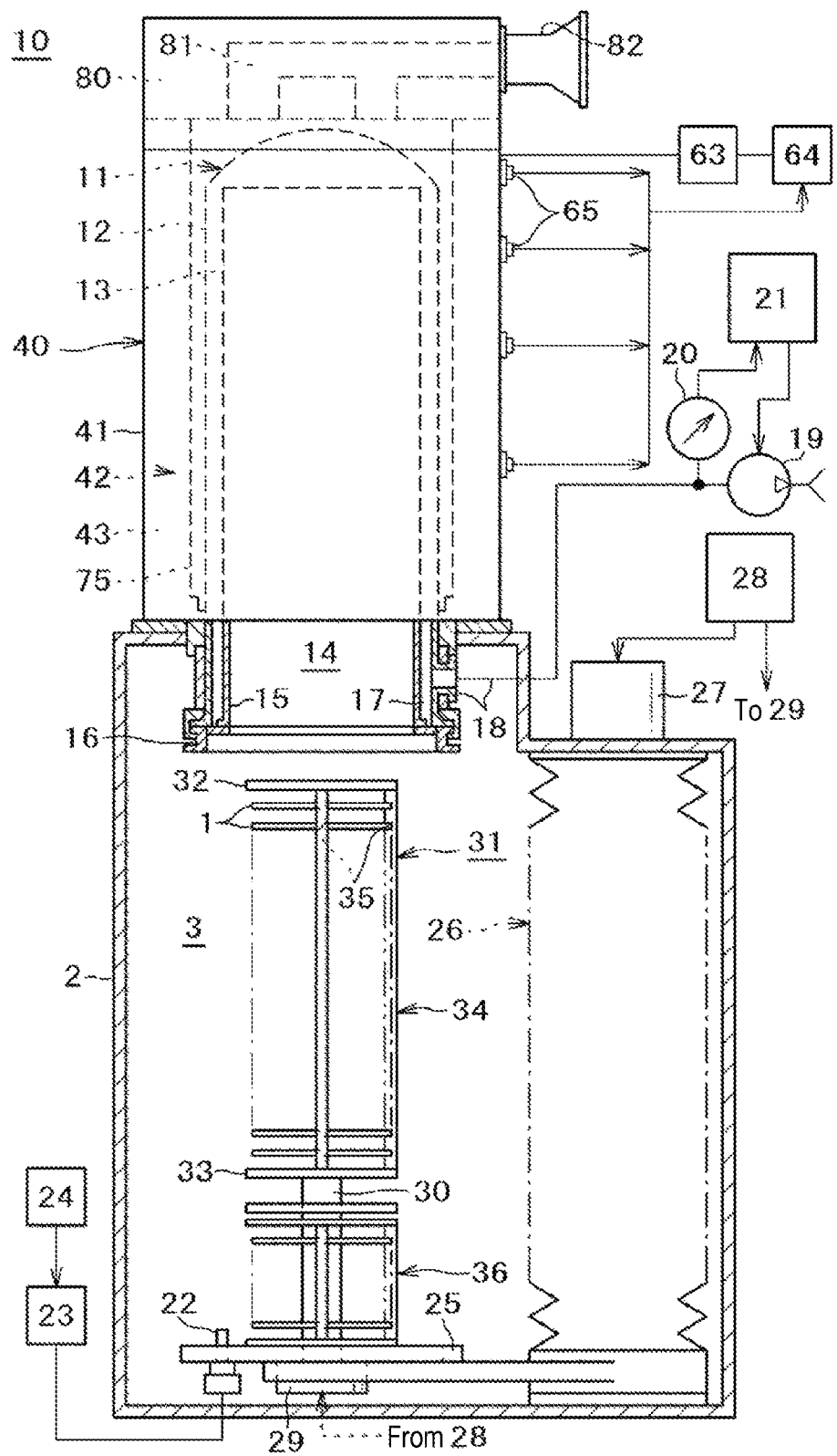
FIG. 1 is a partially-cut front view illustrating a substrate processing apparatus according to an embodiment of the present disclosure.
Figure 2:
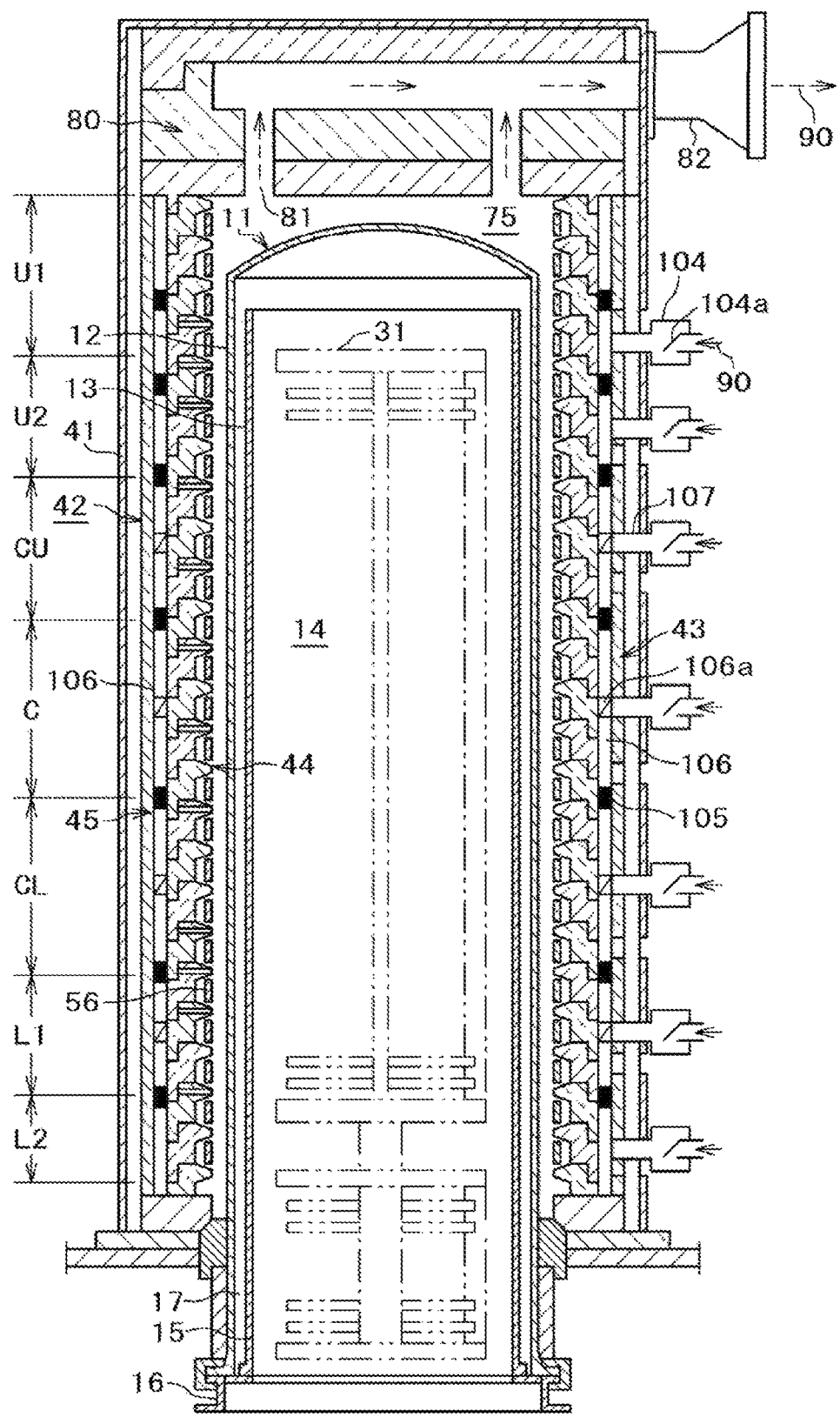
FIG. 2 is a front cross-sectional view of a substrate processing apparatus according to an embodiment of the present disclosure.

In the present embodiment, as illustrated in FIGS. 1 and 2, a substrate processing apparatus 10 according to the present disclosure is configured as a processing apparatus which performs a film-forming process in a method of manufacturing a semiconductor device.

The substrate processing apparatus 10 illustrated in FIG. 1 includes a process tube 11 as a supported vertical reaction tube, and the process tube 11 includes an outer tube 12 and an inner tube 13 disposed to be concentric with each other. The outer tube 12 is made of quartz ($SiO_2$), and integrally formed in a cylindrical shape with its upper end closed and its lower end opened. The inner tube 13 is formed in a cylindrical shape with both its upper and lower ends opened. A hollow cylindrical portion of the inner tube 13 forms a process chamber 14 into which a boat, which will be described later, is loaded, and a lower end opening of the inner tube 13 forms a furnace opening 15 for loading and unloading the boat. As will be described later, a boat 31 is configured to hold a plurality of wafers in a long aligned state. Therefore, an inner diameter of the inner tube 13 is set to be larger than a maximum outer diameter (e.g., a diameter of 300 mm) of wafers 1 as substrates to be handled.

A lower end portion between the outer tube 12 and the inner tube 13 is hermetically sealed by a manifold 16 formed in a substantially cylindrical shape. The manifold 16 is detachably attached to each of the outer tube 12 and the inner tube 13 for replacement or the like of the outer tube 12 and the inner tube 13. Since the manifold 16 is supported by a housing 2, the process tube 11 is vertically installed. Hereinafter, in the drawings, only the outer tube 12 may be illustrated as the process tube 11.

An exhaust passage 17 is formed in a circular ring shape having a fixed width in a cross sectional shape by a gap between the outer tube 12 and the inner tube 13. As illustrated in FIG. 1, one end of an exhaust pipe 18 is connected to an upper portion of a sidewall of the manifold 16, and the exhaust pipe 18 communicates with a lowermost end portion of the exhaust passage 17. An exhaust device 19 controlled by a pressure controller 21 is connected to the other end of the exhaust pipe 18, and a pressure sensor 20 is connected to the middle of the exhaust pipe 18. The pressure controller 21 is configured to feedback-control the exhaust device 19 based on a measurement result from the pressure sensor 20.

A gas introduction pipe 22 is disposed below the manifold 16 so as to communicate with the furnace opening 15 of the inner tube 13, and a gas supply device 23 configured to supply a precursor gas and an inert gas is connected to the gas introduction pipe 22. The gas supply device 23 is configured to be controlled by a gas flow rate controller 24. A gas introduced from the gas introduction pipe 22 to the furnace opening 15 flows through the process chamber 14 of the inner tube 13 and is exhausted by the exhaust pipe 18 via the exhaust passage 17.

A seal cap 25, which closes the lower end opening, is brought into contact with the manifold 16 from the lower side in the vertical direction. The seal cap 25 is formed in a disc shape substantially equal to the outer diameter of the manifold 16, and is configured to be vertically moved up or down by a boat elevator 26 installed in a standby chamber 3 of the housing 2. The boat elevator 26 includes a motor-driven feed screw shaft device, a bellows and the like, and a motor 27 of the boat elevator 26 is configured to be controlled by a driving controller 28. A rotary shaft 30 is disposed on the center line of the seal cap 25 to be rotatably supported, and the rotary shaft 30 is configured to be rotationally driven by a rotation mechanism 29 as a motor controlled by the driving controller 28. The boat 31 is vertically supported on the upper end of the rotary shaft 30.

The boat 31 includes a pair of upper and lower end plates 32 and 33, and three holding members 34 vertically installed between the end plates 32 and 33, and a plurality of holding grooves 35 are formed at equal intervals in a longitudinal direction in the three holding members 34. The holding grooves 35, 35 and 35 formed in the same stages in the three holding members 34 are opened facing each other. The boat 31 is configured to hold the plurality of wafers 1, in such a state that the wafers 1 are horizontally arranged with the centers of the wafers aligned with one another, by inserting the wafers among the holding grooves 35 of the same stages of the three holding members 34. A heat insulating cap part 36 is disposed between the boat 31 and the rotary shaft 30. The rotary shaft 30 is configured to support the boat 31 lifted up from the upper surface of the seal cap 25 so that the lower end of the boat 31 is separated from the position of the furnace opening 15 by an appropriate distance. The heat insulating cap part 36 is configured to heat-insulate the vicinity of the furnace opening 15.

A heater unit 40 as a heating part (or a heater) is disposed outside the process tube 11 in a concentric relationship with the process tube 11 and is installed to be supported by the housing 2. The heater unit 40 includes a case 41. The case 41 is made of stainless steel (SUS) and has a tubular shape or a cylindrical shape in some embodiments with its upper end closed and its lower end opened. The inner diameter and the entire length of the case 41 are set larger than the outer diameter and the entire length of the outer tube 12. In addition, as illustrated in FIG. 2, the heater unit 40 is divided into seven control zones U1, U2, CU, C, CL, L1 and L2 as a plurality of heating regions (heating control zones) from an upper end side to a lower side of the heater unit 40.

A heat insulating structure 42, which is an embodiment of the present disclosure, is installed in the case 41. The heat insulating structure 42 according to the present embodiment has a tubular shape or a cylindrical shape in some embodiment, and a sidewall portion 43 of the cylindrical body is formed in a multi-layer structure. That is, the heat insulating structure 42 includes a sidewall outer layer 45 disposed outside the sidewall portion 43 and a sidewall inner layer 44 disposed inside the sidewall portion 43, and further includes a partition portion 105 configured to separate the sidewall portion 43 into a plurality of zones (regions) in the vertical direction between the sidewall outer layer 45 and the sidewall inner layer 44 and an annular buffer 106 as a buffer part installed between the partition portion 105 and its adjacent partition portion 105.

Furthermore, the annular buffer 106 is configured to be divided according to its length into a plurality of portions by a partition portion 106a as a slit. That is, the partition portion 106a is installed to separate the annular buffer 106 into the plurality of portions according to the length of the zones. In the present disclosure, the partition portion 105 will be referred to as a first partition portion 105 and the partition portion 106a will be referred to as a second partition portion 106a. Alternatively, the partition portion 105 may be referred to as a separation portion configured to separate the partition portion 105 into a plurality of cooling zones. The control zones CU, C, CL, L1 and L2 and the annular buffer 106 described above are installed so as to face each other, and it is configured so that a height of each control zone and a height of the annular buffer 106 are substantially equal to each other. On the other hand, it is configured so that the heights of the control zones U1 and U2 described above are different from the height of the annular buffer 106 facing these control zones. Specifically, since it is configured so that the height of the annular buffer 106 facing the control zones U1 and U2 is lower than the height of each zone, cooling air 90 can be efficiently supplied to each control zone. This makes it possible to make the cooling air 90 supplied to the control zones U1 and U2 equal to the cooling air 90 supplied to the other control zones, thereby performing the same temperature control as that in the control zones CU, C, CL L1 and L2 even in the control zones U1 and U2.

In particular, since it is configured so that a height of the annular buffer 106 facing the control zone U1 for heating an inner space 75 on an exhaust duct 82 side is lower than ½ of a height of each zone, the cooling air 90 can be efficiently supplied to the control zone U1. This makes it possible to perform the same temperature control as that in the other control zones even in the control zone U1 closest to the exhaust side.

Furthermore, since the partition portion 105 disposed in the uppermost portion is at a position higher than a substrate processing region of the boat 31 and lower than the height of the process tube 11 (a position substantially equal to the height of the inner tube 13), and the partition portion 105 disposed in the second uppermost portion is at a position substantially equal to that of the wafer 1 held on the upper end portion of the boat 31, the cooling air 90 can be efficiently brought into contact with the exhaust side of the process tube 11 (a portion on which the wafer 1 is not held), thereby performing cooling like the process tube 11 corresponding to the substrate processing region of the boat 31. As a result, the entire process tube 11 can be uniformly cooled.

In addition, a check damper 104 as a back diffusion prevention part is installed in each zone. Furthermore, it is configured so that the cooling air 90 is supplied to the annular buffer 106 via a gas introduction path 107 by opening and closing a back diffusion prevention body 104a. Then, it is configured so that the cooling air 90 supplied to the annular buffer 106 flows through a gas supply passage installed in a sidewall inner layer 44 (not shown in FIG. 2) and is supplied from an opening hole, which is a portion of a supply path including the gas supply passage, to the inner space 75.

Furthermore, when the cooling air 90 is not supplied from a gas source (not shown), the back diffusion prevention body 104a is configured to serve as a lid so that an atmosphere of the inner space 75 does not flow backward. An open pressure of the back diffusion prevention body 104a may be changed according to the zone. In addition, a heat insulating cloth 111 as a blanket is installed between the outer peripheral surface of the sidewall outer layer 45 and the inner peripheral surface of the case 41 so as to absorb a thermal expansion of metal.

Furthermore, it is configured so that the cooling air 90 supplied to the annular buffer 106 flows through the gas supply passage installed in the sidewall inner layer 44 (not shown in FIG. 2) and is supplied from the opening hole to the inner space 75.

As illustrated in FIGS. 1 and 2, the upper end side of the sidewall portion 43 of the heat insulating structure 42 is covered with a ceiling wall portion 80 as a ceiling portion so as to close the inner space 75. An exhaust port 81 as a portion of an exhaust passage configured to exhaust the atmosphere of the inner space 75 is annually formed in the ceiling wall portion 80, and a lower end which is an upstream side end of the exhaust port 81 communicates with the inner space 75. A downstream side end of the exhaust port 81 is connected to the exhaust duct 82.

Next, an operation of the substrate processing apparatus 10 will be described.

As illustrated in FIG. 1, when a predetermined number of wafers 1 are charged on the boat 31, the seal cap 25 is raised by the boat elevator 26 such that the boat 31 holding a group of wafers 1 is loaded into the process chamber 14 of the inner tube 13 (boat loading). The seal cap 25 reaching an upper limit is pressed and brought into contact with the manifold 16 so as to seal interior of the process tube 11. The boat 31 supported by the seal cap 25 is kept in the process chamber 14.

Subsequently, the interior of the process tube 11 is exhausted by the exhaust pipe 18. In addition, the temperature controller (temperature control part) 64 sequence-controls a heating element driving device 63 so that the interior of the process tube 11 is heated to a target temperature by a heating element 56 installed on the sidewall portion 43. An error between an actual rising temperature inside the process tube 11 and a target temperature for the sequence control of the temperature controller 64 is corrected by feedback control based on measurement result of thermocouples 65. Furthermore, the boat 31 is rotated by the rotation mechanism 29. In addition, although only four thermocouples 65 are illustrated in FIG. 1, they are installed near the heating element 56 for each of the control zones U1, U2, CU, C, CL, L1 and L2 illustrated in FIG. 2. Details of a configuration and a control of the heater unit 40 will be described later. In addition to the thermocouples 65, thermocouples may be installed in the process tube 11.

When an internal pressure and a temperature of the process tube 11 and a rotation of the boat 31 reach a stable state as a whole, the precursor gas is introduced into the process chamber 14 of the process tube 11 from the gas introduction pipe 22 by the gas supply device 23. The precursor gas introduced by the gas introduction pipe 22 flows through the process chamber 14 of the inner tube 13 and is exhausted by the exhaust pipe 18 via the exhaust passage 17. A predetermined film is formed on each of the wafers 1 by a thermal CVD reaction by the contact of the precursor gas with the wafers 1 heated to a predetermined processing temperature when flowing through the process chamber 14.

After a lapse of a predetermined processing time, introduction of a processing gas is stopped and then a purge gas such as a nitrogen gas or the like is introduced into the process tube 11 from the gas introduction pipe 22. Simultaneously, the cooling air 90 as a cooling gas is supplied from an intake pipe 101 to the gas introduction path 107 via the back diffusion prevention body 104a. The supplied cooling air 90 is temporarily stored in the annular buffer 106 and is injected from a plurality of opening holes 110 to the inner space 75 via a gas supply passage 108. The cooling air 90 injected from the opening 110 to the inner space 75 is exhausted by the exhaust port 81 and the exhaust duct 82.

Since the entire heater unit 40 is forcibly cooled by the flow of the cooling air 90, the heat insulating structure 42 is rapidly cooled together with the process tube 11. Furthermore, since the inner space 75 is isolated from the process chamber 14, the cooling air 90 can be used as the cooling gas. However, an inert gas such as a nitrogen gas or the like may be used as the cooling gas in order to further enhance the cooling effect or to prevent corrosion of the heating element 56 at a high temperature due to an impurity in the air.

When the temperature of the process chamber 14 drops to a predetermined temperature, the boat 31 supported by the seal cap 25 is lowered by the boat elevator 26 and is unloaded from the process chamber 14 (boat unloading).

Thereafter, the aforementioned operation is repeatedly performed so that the film-forming process is performed on the wafers 1 by the substrate processing apparatus 10.

Figure 3:
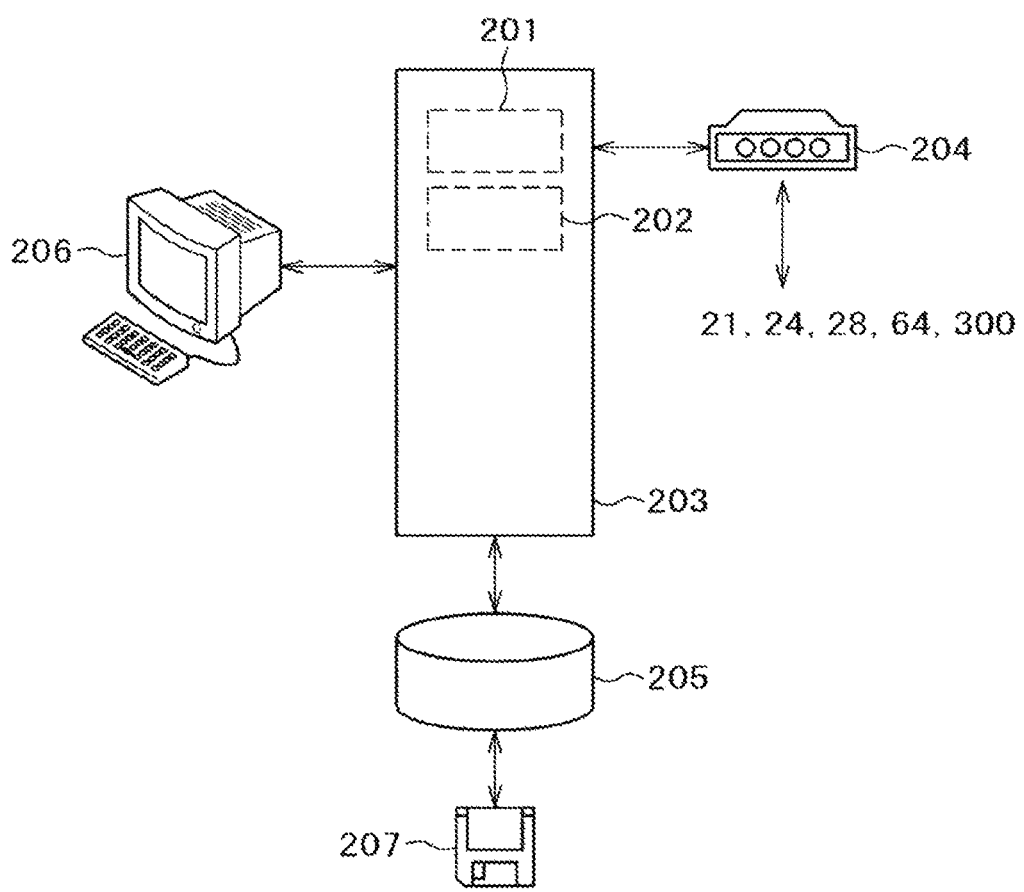
FIG. 3 is a diagram illustrating a hardware configuration of a control computer of a substrate processing apparatus according to an embodiment of the present disclosure.

As illustrated in FIG. 3, a control computer 200 as a control part (or a controller) includes a computer main body 203 including a central processing unit (CPU) 201, a memory 202 and the like, a communication interface (IF) 204 as a communication part, and a storage device 205 as a storage part, and a display/input device 206 as an operation part. That is, the control computer 200 includes a configuration part as a general computer.

The CPU 201, which constitutes the center of the operation part, executes a control program stored in the storage device 205, and executes a recipe (for example, a process recipe) recorded in the storage device 205 according to an instruction from the display/input device 206. It is also needless to say that the process recipe includes temperature control from step S1 to step S6, which will be described later, illustrated in FIG. 4.

In addition, a read only memory (ROM), an electrically erasable programmable read only memory (EEPROM), a flash memory, a hard disk, or the like is used as a recording medium 207 storing an operation program or the like of the CPU 201. In the present disclosure, a random access memory (RAM) functions as a work area or the like of the CPU.

The communication IF 204 is electrically connected to the pressure controller 21, the gas flow rate controller 24, the driving controller 28, and the temperature controller 64 (these controllers may be generally referred to as a sub controller), and can exchange data on operations of respective components. Further, it is also electrically connected to a valve control part 300, which will be described later, so as to exchange data for controlling a multi-cooling unit.

Although the control computer 200 has been described as an example in the embodiment of the present disclosure, the present disclosure is not limited thereto but may be realized using a normal computer system. For example, the aforementioned processing may be executed by installing a program from the recording medium 207 such as a CDROM, a USB or the like storing the program for executing the aforementioned processing, on a general-purpose computer. Alternatively, the communication IF 204 including a communication line, a communication network, a communication system, and the like may be used. In this case, for example, the program may be posted on a bulletin board of the communication network, and may be provided by being superimposed on a carrier wave via the network. Then, the aforementioned processing may be executed by activating the program thus provided and executing the same under the control of an operating system (OS) in the same manner as other application programs.

Figure 4:
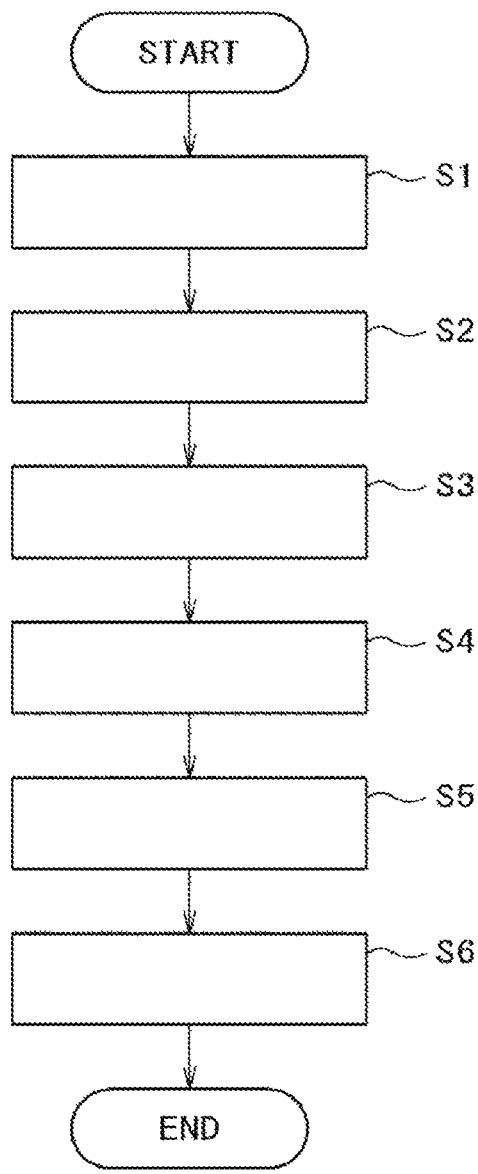
FIG. 4 is a flowchart illustrating an example of a temperature-related process during a film-forming process according to an embodiment of the present disclosure.
Figure 5:
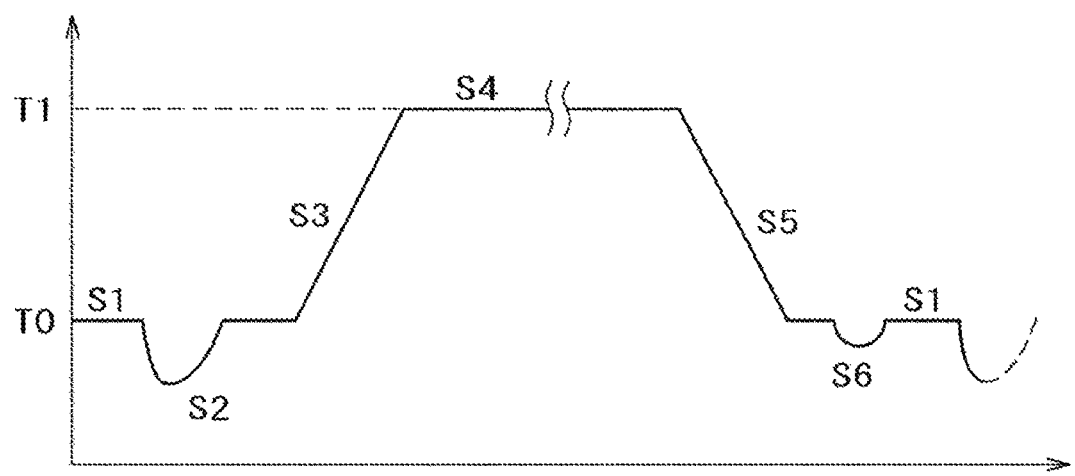
FIG. 5 is a diagram illustrating an in-furnace temperature change in the flowchart illustrated in FIG. 4.

Next, an example of the film-forming process performed in the substrate processing apparatus 10 will be described with reference to FIGS. 4 and 5. Reference numerals S1 to S6 shown in FIG. 5 indicate that steps S1 to S6 in FIG. 4 are performed.

Step S1 is a process of stabilizing the in-furnace temperature to a relatively low temperature T0. At step S1, the wafer 1 has not yet been inserted into the furnace.

Step S2 is a process of inserting the wafer 1 held in the boat 31 into the furnace. Since the temperature of the wafer 1 is lower than the in-furnace temperature T0 at this time, the in-furnace temperature is temporarily lower than T0 as a result of inserting the wafer 1 into the furnace, but the in-furnace temperature is stabilized to the temperature T0 again after an elapse of some time by the temperature controller 64 or the like. For example, when the temperature T0 is a room temperature, this step may be omitted and it is not an essential step.

Step S3 is a process of raising the in-furnace temperature by the heater unit 40 from the temperature T0 to a target temperature T1 for performing the film-forming process on the wafer 1.

Step S4 is a process of maintaining and stabilizing the in-furnace temperature to the target temperature T1 in order to perform the film-forming process on the wafer 1.

Step S5 is a process of gradually lowering the in-furnace temperature from the temperature T1 to the relatively low temperature T0 again by the cooling unit 100 and the heater unit 40, which will be described later, after the film-forming process is completed. Furthermore, the in-furnace temperature may be rapidly cooled from the processing temperature T1 to the temperature T0 by the cooling unit 100 while turning off the heater unit 40.

Step S6 is a process of taking out the wafer 1 on which the film-forming process has been performed from the interior of the furnace together with the boat 31.

When an unprocessed wafer 1 to be subjected to the film-forming process remains, the processed wafer 1 on the boat 31 is replaced with the unprocessed wafer 1, and a series of processes of these steps S1 to S6 are repeatedly performed.

The processes of steps S1 to S6 obtain a stable state in which the in-furnace temperature is within a predetermined minute temperature range with respect to the target temperature and continues for a predetermined time, and then proceed to a next step. Alternatively, recently, in order to increase the number of wafers 1 to be subjected to the film-forming process in a certain time, the process may proceed to the next step without obtaining a stable state at steps S1, S2, S5, S6, and the like.

Figure 6:
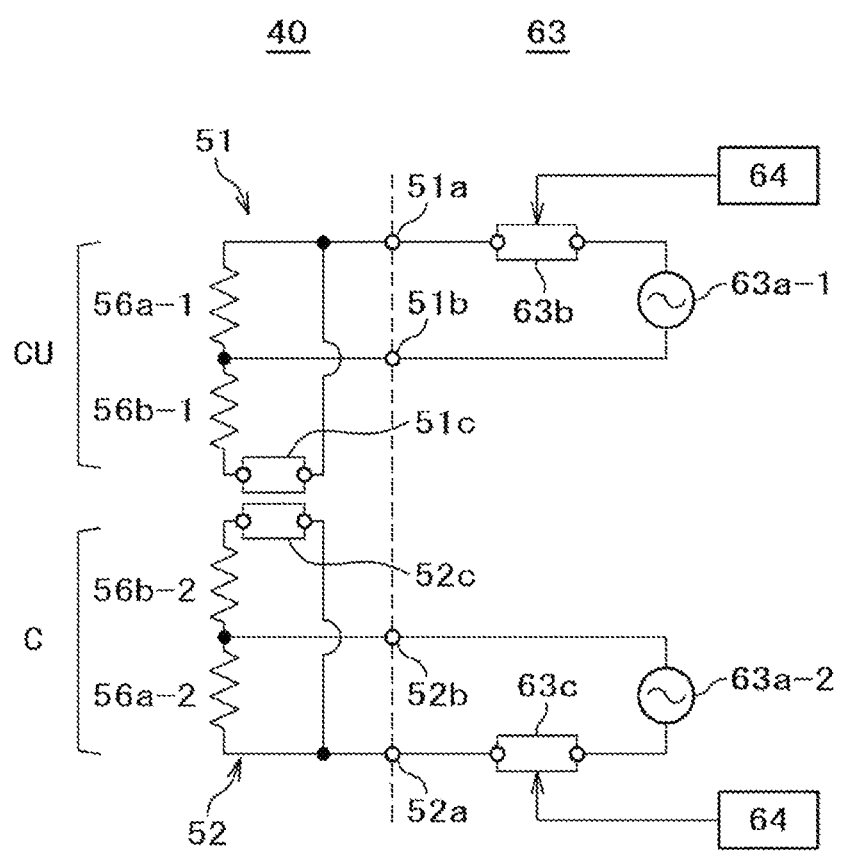
FIG. 6 is a diagram illustrating a resistance circuit according to an embodiment of the present disclosure.

The heater unit 40 has a resistance circuit installed for each of the control zones U1, U2, CU, C, CL, L1 and L2. Although FIG. 6 illustrates resistance circuits of the control zones CU and C, the control zones U2, CU, CL and L1 have the same configuration as the control zone C. Since U1 and L2 are not parallel circuits, they have different circuit configurations from CU and C. Each resistance circuit includes at least the heating element 56 configured to raise the internal temperature of the process tube 11 by heat generation, in which resistance values of the heating elements 56 in the respective control zones are set to be equalized. That is, the heating elements 56 as heat generation parts (or heat generators) are divided into the plurality of control zones U1, U2, CU, C, CL, L1 and L2. The heating elements 56 each include, for example, a resistive heater such as a carbon heater or the like.

As illustrated in FIG. 6, a resistance circuit 51 as an output circuit in the control zone CU is a parallel circuit including heating elements 56a-1 and 56b-1 wired in parallel between terminals 51a and 51b. The heating elements 56 in the control zone CU are configured as the heating elements 56a-1 and 56b-1 having the same resistance value. More specifically, one end of the heating element 56a-1 is connected to the terminal 51a and the other end thereof is connected to the terminal 51b. Furthermore, one end of the heating element 56b-1 is connected to the terminal 51b, and the other end thereof is connected to the terminal 51a via a power regulator 51c which is an output variable element. Therefore, electric power output to the heating element 56a and electric power output to the heating element 56b-1 can be made different from each other. For example, when the power regulator 51c is a resistor having a predetermined resistance value, the electric power output to the heating element 56a-1 can be made larger than the electric power output to the heating element 56b-1.

Furthermore, the heating element 56a-1 is disposed at an upper side of the control zone CU, and the heating element 56b-1 is disposed at a lower side of the control zone CU. Therefore, the electric power output to the heating element 56a-1 at the upper side of the control zone CU can be made larger than the electric power output to the heating element 56b-1 at the lower side of the control zone CU, thereby outputting different electric powers to the heating elements in the vertical direction in the control zone CU.

The heating element driving device 63 supplies a voltage obtained by adjusting an output of an AC power source 63a-1 by a power regulator 63b to between the terminals 51a and 51b. The power regulator 63b includes a thyristor having an anode connected to one end of the AC power source 63a-1, a cathode being connected to the terminal 51a, and a gate to which a control signal from the temperature controller 64 is input. The other end of the AC power source 63a-1 is connected to the terminal 51b.

As illustrated in FIG. 6, a resistance circuit 52 as an output circuit in the control zone C is a parallel circuit including heating elements 56a-2 and 56b-2 wired in parallel between terminals 52a and 52b. The heating elements 56 in the control zone C also include the heating elements 56a-2 and 56b-2. More specifically, one end of the heating element 56a-2 is connected to the terminal 52a and the other end thereof is connected to the terminal 52b. Furthermore, one end of the heating element 56b-2 is connected to the terminal 52b and the other end thereof is connected to the terminal 52a via a power regulator 52c which is an output variable element. Therefore, electric power output to the heating element 56a-2 and electric power output to the heating element 56b-2 can be made different from each other. For example, when the power regulator 52c is a resistor having a predetermined resistance value, the electric power output to the heating element 56a-2 can be made larger than the electric power output to the heating element 56b-2.

Furthermore, the heating element 56b-2 is disposed at an upper side of the control zone C, and the heating element 56a-2 is disposed at a lower side of the control zone C. Therefore, the electric power output to the heating element 56b-2 at the upper side of the control zone C can be made smaller than the electric power output to the heating element 56a-2 at the lower side of the control zone C, thereby outputting different electric powers to the heating elements in the vertical direction in the control zone C.

The heating element driving device 63 supplies a voltage obtained by adjusting an output of an AC power source 63a-2 by a power regulator 63c to between the terminals 52a and 52b. The power regulator 63c includes a thyristor having an anode connected to one end of the AC power source 63a-2, a cathode being connected to the terminal 52a, and a gate to which a control signal from the temperature controller 64 is input. The other end of the AC power source 63a-2 is connected to the terminal 52b.

In FIG. 6, two heating elements are connected in parallel, but three or more heating elements may be connected in parallel. That is, two or more heating elements are arranged and wired in each control zone. Furthermore, the power regulator may be installed in at least one heating element. That is, the resistance circuits 51 and 52 are parallel circuits, and the power regulators 51c and 52c are configured to be installed in one or more of circuits constituting the parallel circuits.

The temperature controller 64 adjusts the electric power supplied to the heating elements 56 based on the temperature detected by the thermocouples 65, and controls the temperature to the detected temperature. Further, the temperature controller 64 supplies different electric powers to the resistance circuit of each control zone by supplying different voltages to the terminals of the resistance circuit of each control zone. In addition, since the resistance circuit is configured to make the electric power output to a circuit in which the power regulator is not installed larger than the electric power output to a circuit to which the power regulator is connected, the temperature controller 64 can supply different electric power to each of the circuits constituting the parallel circuit in each control zone only by supplying the voltage to the terminals of the resistance circuit of each control zone. Thus, the temperature controller 64 can supply different electric powers in the vertical direction in each control zone.

Figure 7:
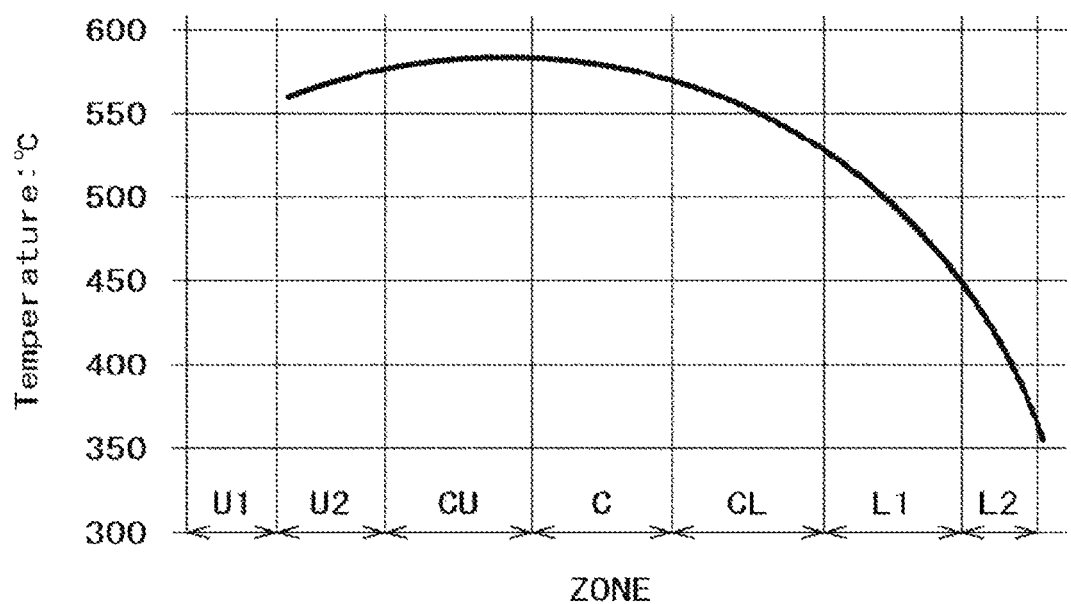
FIG. 7 is a diagram illustrating an in-furnace temperature distribution when power outputs of all control zones are used in common and a temperature is stabilized.

The necessity of power balance adjustment in each control zone of the heater unit 40 will be described with reference to FIG. 7. FIG. 7 illustrates an in-furnace temperature distribution in a stabilized temperature state when power outputs (wall surface load densities) of all the control zones are used in common. In the present disclosure, the wall surface load density indicates a heater output per unit area of the wall surface. An $N_2$ gas was supplied into the furnace at this time, and an in-furnace pressure is 33 Pa. Even when the resistance value and an voltage applied voltage of the heating element are kept constant and the power output is kept constant, a temperature drop occurs at the upper and lower ends (control zones L1 and L2) of the process tube 11 due to influence of heat radiation from the ceiling portion or furnace opening of the process tube 11, causing a temperature difference of 200 degrees C. or higher in the in-furnace temperature distribution of the process tube 11.

A method of power balance adjustment in the control zones of the heater unit 40 will be described with reference to FIGS. 8 to 12. The power outputs of the control zones U1, U2, CU, C, CL, L1 and L2 are adjusted so that the temperature distribution of the control zones U2, CU, C, CL and L1 located in a wafer region becomes uniform.

Figure 8:
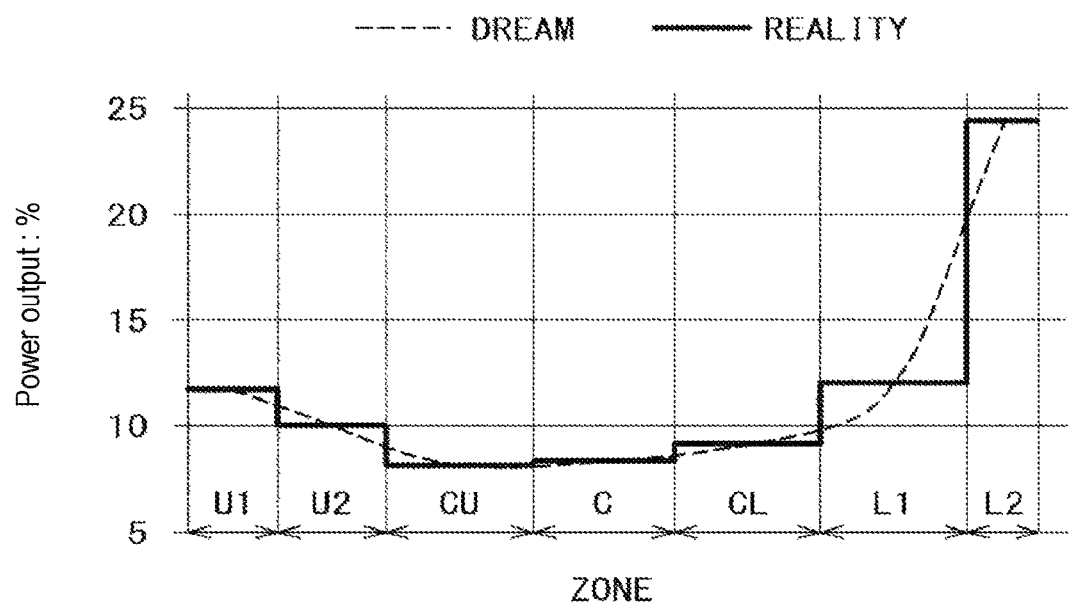
FIG. 8 is a diagram illustrating a power output distribution of each control zone according to a comparative example.

First, a case where power outputs in the respective control zones are constant by using resistance circuits according to a comparative example in FIG. 12 will be described with reference to FIGS. 8 and 9. FIG. 8 illustrates a power output distribution of control zones U1, U2, CU, C, CL, L1 and L2 according to a comparative example adjusted so that the temperature distribution of a wafer region of the control zones U2, CU, C, CL and L1 becomes uniform.

Figure 12:
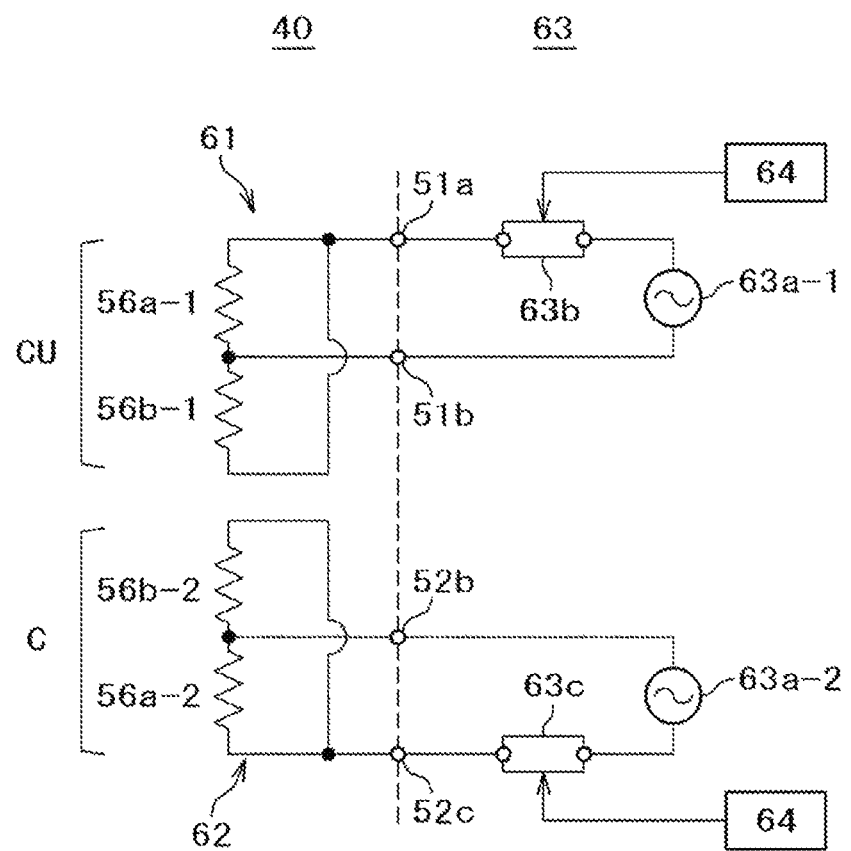
FIG. 12 is a diagram illustrating a resistance circuit according to a comparative example.

As illustrated in FIG. 12, in respective resistance circuits 61 and 62 according to the comparative example, the power regulator 51c is not installed between the heating element 56b and the terminal 51a and the power regulator 52c is not installed between the heating element 56b and the terminal 52a, unlike the resistance circuits 51 and 52 according to the embodiment in FIG. 6. Since the heating element 56a and the heating element 56b have the same resistance value and thus the power outputs in the respective control zones are constant, a stepwise power output distribution as shown in FIG. 8 is obtained. In FIG. 8, this power distribution is shown as a solid line REALITY. On the other hand, an ideal power output distribution for making the in-furnace temperature uniform is shown as a broken line DREAM. The DREAM is an estimated value based on the temperature distribution of FIG. 7 and an actual power measurement value of FIG. 8. The REALTY shows that the power outputs are provided to match DREAM near the center of the control zones. A difference between REALITY and DREAM becomes larger as it goes to the upper and lower control zones of the process tube 11.

Figure 9:
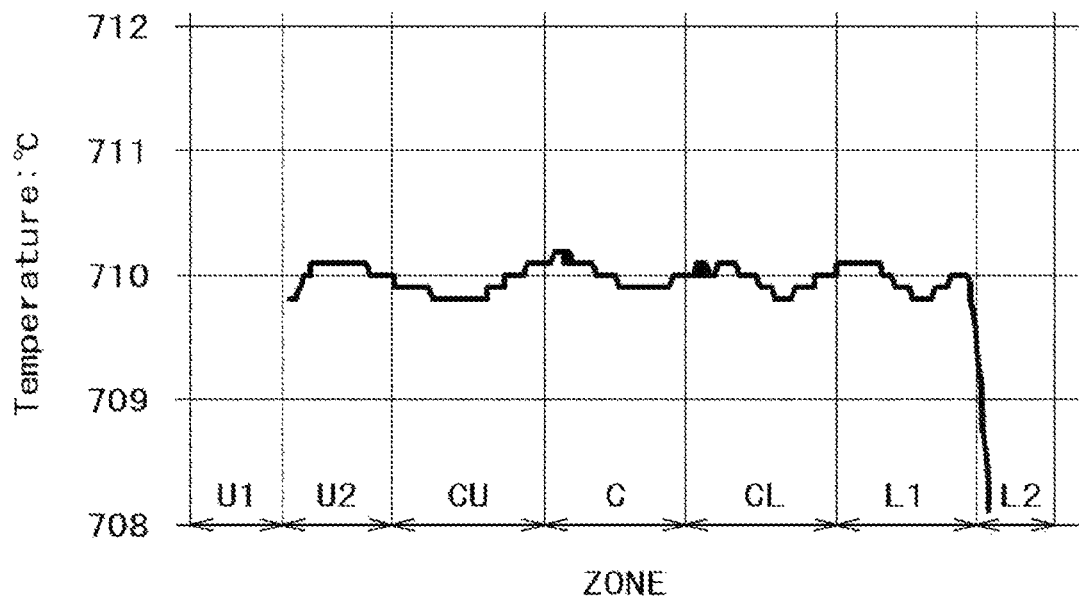
FIG. 9 is a diagram illustrating an in-furnace temperature distribution corresponding to the power distribution of FIG. 8.

FIG. 9 illustrates an in-furnace temperature distribution corresponding to the power distribution of FIG. 8. Similar to FIG. 7, an $N_2$ gas is supplied into the furnace at this time, and an in-furnace pressure is 33 Pa. A temperature difference of 0.4 to 1.0 degrees C. as shown in FIG. 9 occurs due to a difference between the REALITY and the DREAM in FIG. 8.

Next, adjustment of the power output balance using the resistance circuits in FIG. 6 will be described with reference to FIGS. 10 and 11. A solid line NEW in FIG. 10 indicates a power output distribution in which the power output balance is adjusted using the resistance circuits in FIG. 6. A broken line DREAM in FIG. 10 indicates an ideal power output distribution equal to the DREAM in FIG. 8.

In the control zone CU, the output power of the upper heating element 56a is set larger than the output power of the lower heating element 56b using the resistance circuit in FIG. 6. The resistance circuit of the control zone U2 is similar to the resistance circuit 51 of the control zone CU in FIG. 7, and the output power of the upper heating element is set larger than the output power of the lower heating element. Further, the resistance circuit of the control zone U1 is similar to the resistance circuit 61 of the control zone CU in FIG. 12, and the output powers of the upper and lower heating elements are set equal.

In the control zone C, the output power of the lower heating element 56a is set larger than the output power of the upper heating element 56a using the resistance circuit in FIG. 6. The resistance circuit of the control zone CL is similar to the resistance circuit 52 of the control zone C in FIG. 6, and the output power of the lower heating element is set larger than the output power of the upper heating element. Further, the resistance circuit of the control zone L1 is similar to the resistance circuit 52 of the control zone C in FIG. 7, and the output power of the lower heating element is set larger than the output power of the upper heating element. In addition, the resistance circuits of the control zones U1 and L2 are connected in series, and the output powers of the upper and lower heating elements are set equal.

Figure 10:
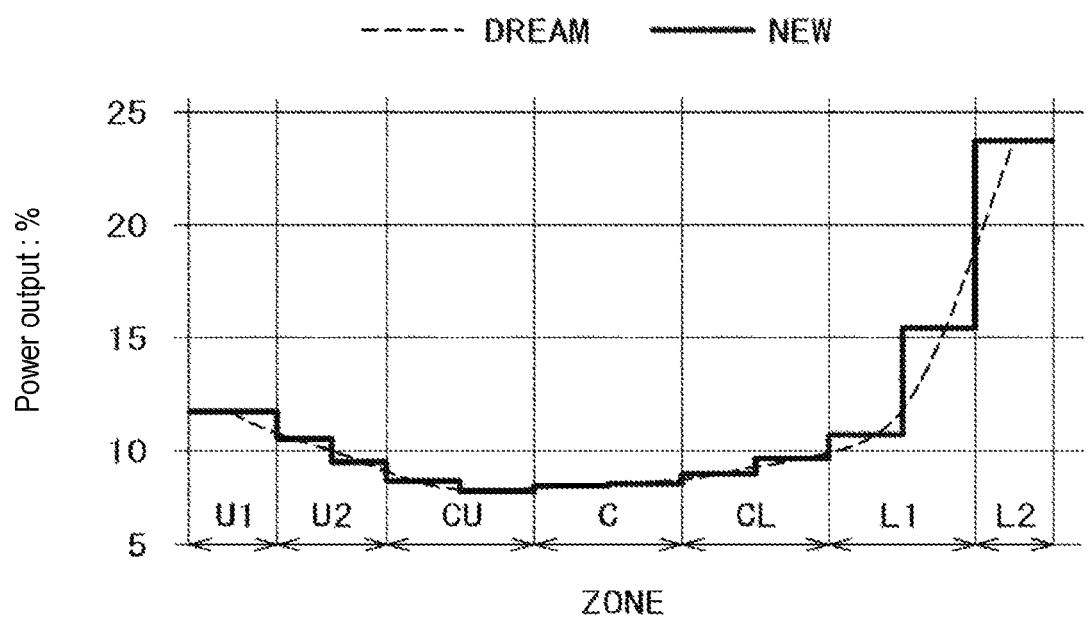
FIG. 10 is a diagram illustrating a power output distribution in which a power output balance is adjusted by using the resistance circuit in FIG. 6.

Therefore, a power output distribution as indicated by NEW in FIG. 10 can be obtained. In the control zones U1 and L2, the NEW shows that the power outputs are provided to match DREAM near the center. In the control zones U2 to L1, the NEW shows that the power outputs are provided to match DREAM near the center of each of the upper side and the lower side. A difference between the NEW and the DREAM in FIG. 10 may be made smaller than the difference between the REALITY and the DREAM in FIG. 8.

Figure 11:
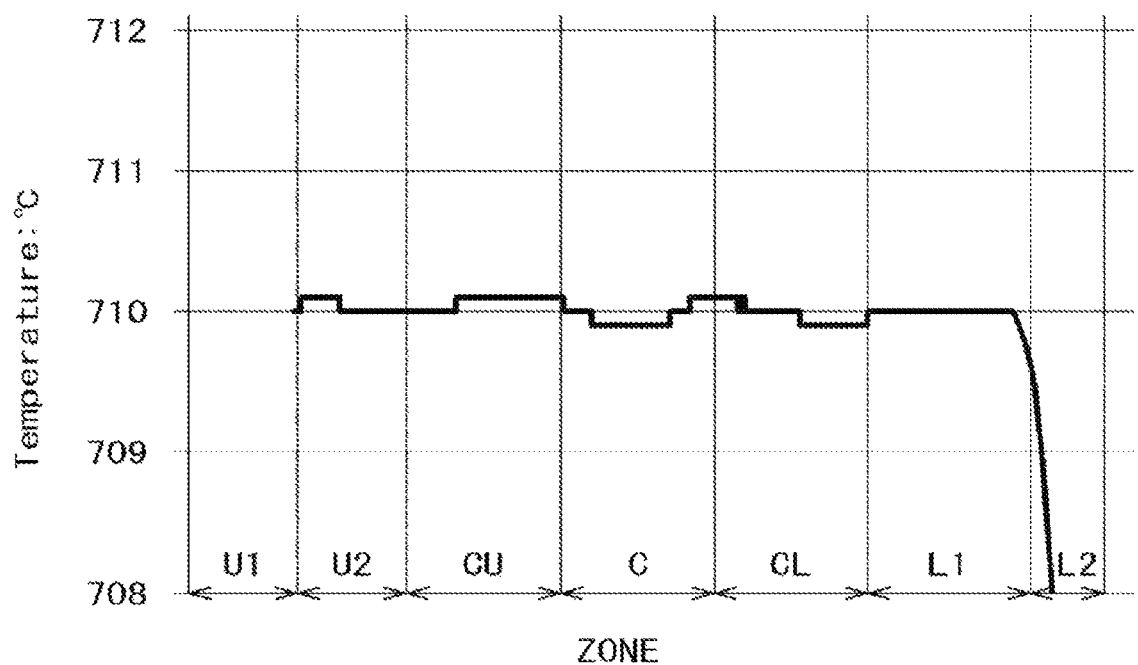
FIG. 11 is a diagram illustrating an in-furnace temperature distribution corresponding to the power distribution of FIG. 10.

FIG. 11 illustrates an in-furnace temperature distribution in the power output distribution of FIG. 10. Similar to FIG. 7, an $N_2$ gas is supplied into the furnace at this time, and an in-furnace pressure is 33 Pa. A temperature difference in the wafer region of the respective control zones U2, CU, C, CL and L1 is set at 0.2 degrees C. or lower, and thus the uniformity of the in-furnace temperature distribution is improved compared with the comparative example. As described above, according to the present embodiment, since not only the power outputs among the respective control zones in the wafer region but also the power outputs in the respective control zones can be adjusted, it is possible to make the in-furnace temperature distribution uniform among the wafers. In addition, in FIG. 10, an interior of each of the control zones U2, CU, C, CL and L1 is configured to be divided into two parts, but the present disclosure is not limited thereto, and the number of divisions in the respective control zone U2, CU, C, CL and L1 may be respectively set. Thus, the number of divisions can be set different in the respective control zones U2, CU, C, CL and L1.

Although the power regulators 51c and 52c have been described by way of example as including the resistors, the power regulators 51c and 52c are not limited thereto but may include thyristors, IGBTs, or the like. As another embodiment, FIG. 13 illustrates resistance circuits in which the power regulators include thyristors.

Figure 13:
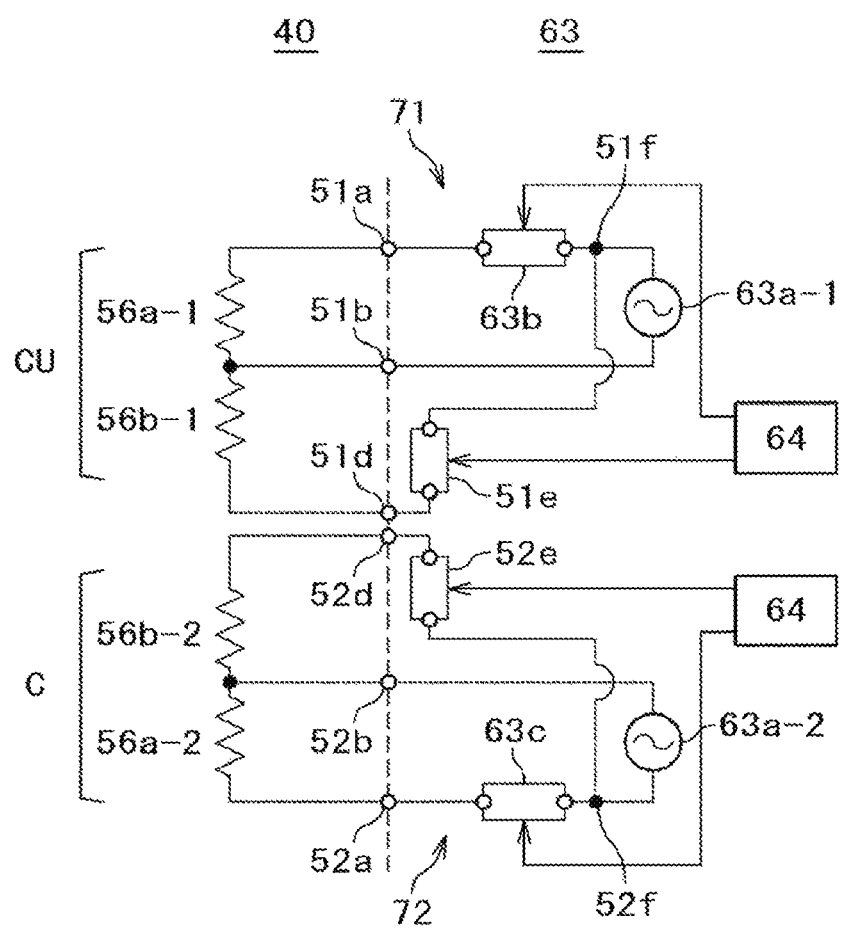
FIG. 13 is a diagram illustrating a resistance circuit according to another embodiment (exemplary modification) of the present disclosure.

As illustrated in FIG. 13, a resistance circuit 71 as an output circuit in the control zone CU is a parallel circuit including heating elements 56a-1 and 56b-1 wired in parallel between terminals 51f and 51b. The heating elements 56 in the control zone CU include the heating elements 56a-1 and 56b-1 having the same resistance value. More specifically, one end of the heating element 56a-1 is connected to the terminal 51f via the terminal 51a and the power regulator 63b, and the other end thereof is connected to the terminal 51b. Furthermore, one end of the heating element 56b-1 is connected to the terminal 51b, and the other end thereof is connected to the terminal 51f via a power regulator 51e which is an output variable element. The power regulator 51e includes a thyristor like the power regulator 63b.

The resistance circuit 71 according to an exemplary modification includes a part of the heater unit 40 and a part of the heating element driving device 63. That is, unlike the resistance circuit 51, the resistance circuit 71 includes the power regulator 51e. The resistance circuit 71 supplies a voltage obtained by adjusting an output of an AC power source 63a by the power regulator 63b based on a control signal from the temperature controller 64 to between the terminals 51a and 51b. Further, it supplies a voltage obtained by adjusting the output of the AC power source 63a by the power regulator 51e based on the control signal from the temperature controller 64 to between the terminals 51d and 51b. Since the heating element 56a-1 and the heating element 56b-1 use the terminal 51b in common and are supplied with electric power from the in-phase AC power source 63a, the resistance circuit 71 is also a kind of parallel circuit.

Depending on the control signal input to a gate of the thyristor of the power regulator 63b and the control signal input to a gate of the thyristor of the power regulator 51e, the electric power output to the heating element 56a-1 and the electric power output to the heating element 56b-1 can be made different. For example, by setting a voltage input to the gate of the thyristor of the power regulator 63b higher than the voltage input to the gate of the thyristor of the power regulator 51e, the electric power output to the heating element 56a-1 can be made larger than the power output to the heating element 56b-1.

Further, the heating element 56a-1 is disposed at an upper side of the control zone CU, and the heating element 56b-1 is disposed at a lower side of below the control zone CU. Therefore, the electric power output to the heating element 56a-1 at the upper side of the control zone CU can be made larger than the electric power output to the heating element 56b-1 at the lower side of the control zone CU, thereby outputting different electric powers to the heating elements in the vertical direction in the control zone CU.

As illustrated in FIG. 13, the resistance circuit 72 in the control zone C is a parallel circuit including the heating elements 56a-2 and 56b-2 wired in parallel between the terminal 52f and 52b. The heating elements 56 in the control zone C include the heating elements 56a-2 and 56b-2 having the same resistance value. More specifically, one end of the heating element 56a-2 is connected to the terminal 52f via the terminal 52a and the power regulator 63c, and the other end thereof is connected to the terminal 52b. Furthermore, one end of the heating element 56b-2 is connected to the terminal 52b, and the other end thereof is connected to the terminal 52f via the power regulator 52e which is an output variable element. The power regulator 52e include a thyristor, like the power regulator 63c.

The resistance circuit 72 according to an exemplary modification includes a part of the heater unit 40 and a part of the heating element driving device 63. That is, unlike the resistance circuit 52, the resistance circuit 72 includes the power regulator 63c. The resistance circuit 72 supplies electric power obtained by adjusting the output of the AC power source 63a by the electric power regulator 52e based on the control signal from the temperature controller 64 to between the terminals 52a and 52b. Further, it supplies electric power obtained by adjusting the output of the AC power source 63a by the power regulator 52e based on the control signal from the temperature controller 64 to between the terminals 52d and 52b.

Depending on the control signal input to a gate of the thyristor of the power regulator 63c and the control signal input to a gate of the thyristor of the power regulator 52e, the electric power output to the heating element 56a-2 and the electric power output to the heating element 56b-2 may be made different. For example, by setting the control signal input to the gate of the thyristor of the power regulator 63c different from the control signal input to the gate of the thyristor of the power regulator 52e, the electric power output to the heating element 56a-2 can be made larger than the electric power output to the heating element 56b-2.

Furthermore, the heating element 56b-2 is disposed at an upper side of the control zone C, and the heating element 56a-2 is disposed at a lower side of the control zone C. Therefore, the electric power output to the heating element 56b-2 at the upper side of the control zone C can be made different from, such as being smaller than the electric power output to the heating element 56a-2 at the lower side of the control zone C, thereby outputting different electric powers to the two heating elements in the vertical direction in the control zone C.

A configuration in which each of the electric power output to the heating element 56a-1 and 56a-2 and the electric power output to the heating element 56b-1 and 56b-2 is adjusted according to an exemplary modification will be described below with reference to FIGS. 14 and 15. In the present disclosure, the CU zone among the control zones will be described below.

Figures 14, 15:
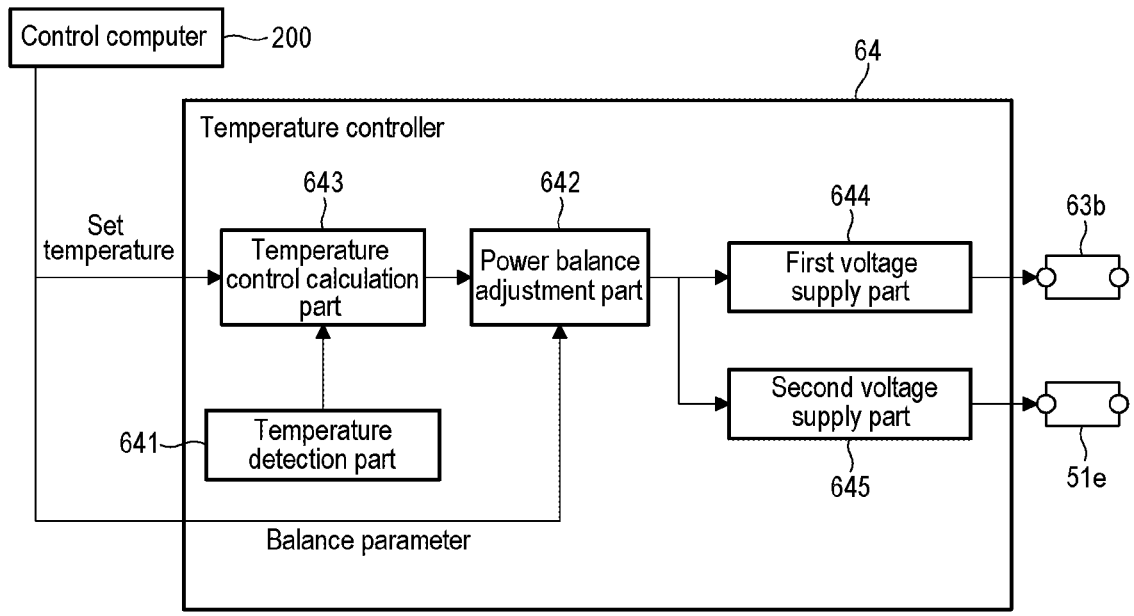
FIG. 14 is a diagram illustrating a configuration of a temperature controller according to another embodiment (exemplary modification) of the present disclosure.
FIG. 15 is a diagram illustrating an example of balance parameters according to another embodiment (exemplary modification) of the present disclosure.

As illustrated in FIG. 14, the temperature controller 64 takes a temperature detected by a temperature detection part (or a temperature detector) 641 (thermocouples 65 in FIG. 2). Further, the temperature controller 64 receives balance parameters, in addition to a set temperature value from the control computer 200 as a higher controller.

The control computer 200 sets upper and lower output ratios as the balance parameters for one control zone. Hereinafter, the upper output ratio will be referred to as Upper_Ratio and the lower output ratio will be referred to as Lower_Ratio. As illustrated in FIG. 15, the balance parameters can be switched according to an instruction from the control computer 200 by holding parameters for each temperature zone. According to the balance parameters instructed by the control computer 200, a power balance adjustment part (or an adjuster) 642 determines upper and lower outputs for one control zone. Further, FIG. 15 illustrates a numerical example of the balance parameters of the CU zone among the control zones.

In the temperature controller 64, a temperature control calculation part (or a temperature control calculator) 643 performs temperature control calculation such that the set temperature instructed by the control computer 200 and the temperature detected by the temperature detection part 641 match, to determine a control calculation result.

Next, the power balance adjustment part 642 determines upper and lower electric powers (effective values) for one control zone by the following equations (1) to (3).

$$\text{Upper power output} = \text{control calculation result} \times \text{Upper\_Ratio} \quad \text{Eq. (1)}$$

$$\text{Lower power output} = \text{control calculation result} \times \text{Lower\_Ratio} \quad \text{Eq. (2)}$$

$$\text{Upper\_ratio} + \text{Lower\_Ratio} = 2.0 \quad \text{Eq. (3)}$$

Where the upper power output and the lower power output are numerals expressed by percentages as a result of the control calculation.

An example of calculating the upper and lower outputs in the power balance adjustment part 642 will be described with reference to FIG. 16.

Figure 16:
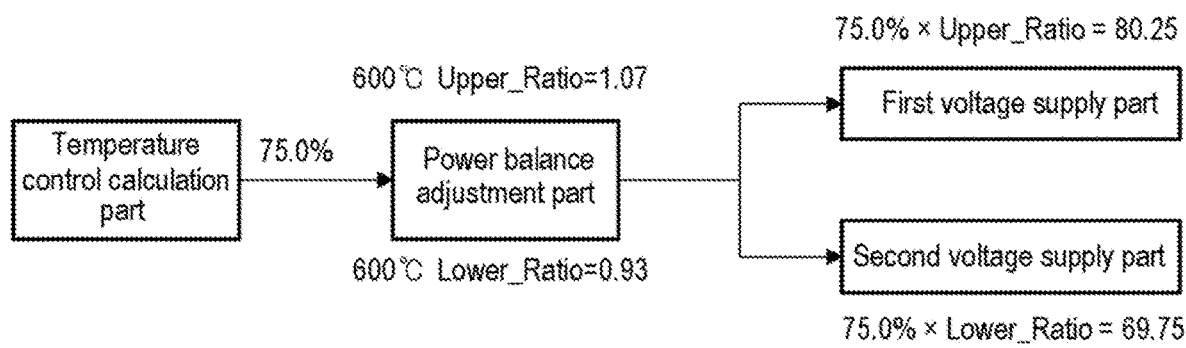
FIG. 16 is a diagram illustrating a calculation example using parameters having a temperature zone of 600 degrees C.

FIG. 16 illustrates an example of calculation using the parameters in which the temperature zone in FIG. 15 is 600 degrees C. Assuming that the result of the control calculation of the temperature control calculation part 643 is 75.0%, the power balance adjustment part 642 calculates an upper power output and a lower power output using Upper_Ratio=1.07 and Lower_Ratio=0.93 as balance parameters at 600 degrees C. by Eqs. (1) to (3), as illustrated in FIG. 16.

$$\text{Upper power output} = 75.0\% \times 1.07 = 80.25\%$$

$$\text{Lower power output} = 75.0\% \times 0.93 = 69.75\%$$

80.25% of the calculated upper power output is supplied to a first power supply part 644, and 69.75% of the calculated lower power output is supplied to a second power supply part 645.

By always setting the sum of Upper_Ratio and Lower_Ratio to 2.0, a temperature waveform does not change significantly because a total voltage as one control zone does not change even when the upper and lower power balances change, which is not required to readjust, for example, a control parameter such as a PID value during PID control. Therefore, although the power supply from the temperature controller 64 is supplied to each control zone as above, different electric powers can be supplied in the vertical direction in each control zone.

The balance parameters can be switched according to an instruction from the control computer 200 by holding a plurality of parameters for each temperature zone as illustrated in FIG. 15. Further, by setting more than two balance parameters for one control zone, it is also easy to supply different electric powers for finer zone division.

FIG. 17A shows an in-furnace temperature distribution and electric power of each control zone according to a comparative example, and FIG. 17B shows an in-furnace temperature distribution and electric power of each control zone according to the modification. FIG. 17C is an example of balance parameters indicating power balance in a product region of control zones U2 to L1.

As described above, in the aforementioned two embodiments of the present disclosure, since the electric power output from each output circuit can be adjusted by installing the plurality of output circuits in each control zone, the interior of each control zone is divided and different wall surface load densities can be output. Therefore, the temperature difference within the wafer region of the respective control zones U2, CU, C, CL and L1 with respect to the target temperature can be suppressed to 0.2 degrees C. or lower.

That is, taking FIGS. 17A to 17C as an example, by reducing Lower_Ratio of the CU zone, the influence from the CU zone to the C zone is reduced, and the (temperature) waveform near a boundary between the CU zone and the C zone (at an upper portion of the C zone) is lowered. The temperature of the upper portion of the C zone is lowered such that the waveform of the entire C zone is raised (=a large amount of electric power can be supplied). Thus, the C zone becomes kept within 0.2 degrees C. Further, in the CL zone, by reducing Upper_Ratio of the L1 zone, the waveform near the boundary between the CL zone and the L1 zone is lowered such that the waveform of the entire CL zone is lowered. Thus, the CL zone is kept 0.2 degrees C. or below. As described above, in the present embodiment using the output variable element, since the balance parameters are set in consideration of the influence of the temperature waveforms of such adjacent respective zones, the temperature difference within the wafer region of the respect zones can be reduced to near close to 0 degrees C.

Similar to the aforementioned two embodiments of the present disclosure, a control zone expansion method in which two control zones are used may be considered as a method of applying different electric powers to the upper portion and the lower portion of one control zone. Advantages of this modification may be as follows by comparing the control zone expansion method and this modification.

(1) In the present embodiment, the thermocouples and the temperature detection part are respectively included in one control zone, but since a plurality of outputs can be calculated by the power balance adjustment part, it is superior in terms of cost compared with the control zone expansion method.

(2) In the present embodiment, since a total voltage for one control zone does not change, the temperature waveform does not change significantly and complexity of adjustment is lowered compared with the control zone expansion method.

(3) In particular, in this modification, by using the balance parameters as one of control parameters, it is possible to change presence or absence of the use of the power balance function without modifying the device. For example, when Upper_Ratio=100% and Lower_Ratio=100% are set, the same power supply as in the case without the power balance function can be performed.

Further, the present disclosure may be applied not only to the semiconductor manufacturing apparatus but also to an apparatus for processing a glass substrate such as an LCD device.

In addition, the present disclosure is directed to a semiconductor manufacturing technique, particularly, to a heat treatment technique in which a substrate to be processed is accommodated in a process chamber and processed in a state where it is heated by a heating device, and may be effectively applied to a substrate processing apparatus used for an oxidation process, a diffusion process, reflow for carrier activation and flattening after ion implantation, a film-forming process by annealing and thermal CVD reaction or the like, for example, on a semiconductor wafer in which a semiconductor integrated circuit device (semiconductor device) is built in.

According to the present disclosure in some embodiments, it is possible to improve uniformity of temperature distribution in a furnace.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heater divided into a plurality of control zones, the heater comprising:
   an output circuit installed for each of the control zones; and
   a plurality of heat generators installed for each of the control zones and configured to raise an internal temperature of a reaction tube by heat generation,
   wherein the output circuit installed for a control zone, which is located in a wafer region, among the control zones:
   includes a parallel circuit in which the plurality of heat generators are wired in parallel; and
   is configured to be capable of adjusting a power outputted from at least one of the plurality of the heat generators by connecting an output variable element to the at least one of the plurality of the heat generators to thereby adjust a power supplied to the at least one of the plurality of the heat generators, and
   wherein the output variable element is configured to adjust the power supplied to the at least one of the plurality of heat generators based on a control signal inputted to the output variable element.

2. The heater according to claim 1, wherein the output variable element is at least one selected from a group consisting of a resistor, a thyristor, and an IGBT.

3. The heater according to claim 1, wherein two or more of circuits constituting the parallel circuit are arranged and wired in each of the control zones.

4. The heater according to claim 1, wherein each of the heat generators is installed individually for each of circuits constituting the parallel circuit.

5. The heater according to claim 1, wherein the power supplied to the at least one of the plurality of heat generators is adjusted while maintaining supply of power to the plurality of heat generators.

6. A method of manufacturing a semiconductor device, comprising:
   processing, by the heater of claim 1, a substrate located in the wafer region.

7. A method of processing a substrate, comprising:
   processing, by the heater of claim 1, the substrate located in the wafer region.

8. A temperature control system, comprising:
   a heater divided into a plurality of control zones, the heater including:
   an output circuit installed for each of the control zones; and
   a plurality of heat generators installed for each of the plurality of control zones and configured to raise an internal temperature of a reaction tube by heat generation in each of the control zones, wherein the output circuit installed for a control zone, which is located in a wafer region, among the control zones:
includes a parallel circuit in which the plurality of heat generators are wired in parallel; and
is configured to be capable of adjusting a power outputted from the at least one of the plurality of heat generators by connecting an output variable element to the at least one of the plurality of the heat generators to thereby adjust a power supplied to the at least one of the plurality of the heat generators, and
wherein the output variable element is configured to adjust the power supplied to the at least one of the plurality of heat generators based on a control signal inputted to the output variable element; and
a temperature controller configured to control the internal temperature of the reaction tube by adjusting electric power supplied to the at least one of the plurality of heat generators.

9. The system according to claim 8, wherein the temperature controller is further configured to output a different electric power for each of the control zones.

10. The temperature control system according to claim 8, wherein the temperature controller is further configured to output different electric powers in a vertical direction in each of the control zones.

11. The temperature control system according to claim 8, wherein the temperature controller is further configured to output a different electric power for each of circuits constituting the parallel circuit in the control zones.

12. The temperature control system according to claim 8, wherein the temperature controller is further configured to output electric power according to a resistance value of each of circuits constituting the parallel circuit in the control zones.

13. The temperature control system according to claim 12, wherein the temperature controller is further configured to make electric power output to a circuit, among the circuits constituting the parallel circuit, in which the output variable element is not installed larger than electric power output to a circuit, among the circuits constituting the parallel circuit, to which the output variable element is connected.

14. The temperature control system according to claim 8, further comprising:
an adjuster configured to adjust electric power output from a circuit, among circuits constituting the parallel circuit, to which the output variable element is connected,
wherein the adjuster is further configured to output a different electric power for each of the circuits constituting the parallel circuit.

15. The temperature control system according to claim 14, further comprising:
a temperature control calculator configured to perform temperature control calculation such that a preset temperature and a temperature detected by a temperature detector match,
wherein the adjuster is configured to determine an output to each of the circuits constituting the parallel circuit based on a ratio of control signals calculated by the temperature control calculator.

16. The temperature control system according to claim 8, wherein the temperature controller is configured to control the heater to adjust the power supplied to the at least one of the plurality of heat generators while maintaining supply of power to the plurality of heat generators.

17. A processing apparatus, comprising
a heater divided into a plurality of control zones, the heater including:
an output circuit installed for each of the control zones; and
a plurality of heat generators installed for each of the plurality of control zones and configured to raise an internal temperature of a reaction tube by heat generation in each of the control zones,
wherein the output circuit installed for a control zone, which is located in a wafer region, among the control zones:
includes a parallel circuit in which the plurality of heat generators are wired in parallel; and
is configured to be capable of adjusting a power outputted from the at least one of the plurality of heat generators by connecting an output variable element to the at least one of the plurality of the heat generators to thereby adjust a power supplied to the at least one of the plurality of the heat generators, and
wherein the output variable element is configured to adjust the power supplied to the at least one of the plurality of heat generators based on a control signal inputted to the output variable element.

18. The processing apparatus according to claim 17, wherein the heater is configured to adjust the power supplied to the at least one of the plurality of heat generators while maintaining supply of power to the plurality of heat generators.

* * * * *